United States Patent
Chatterjee et al.

(10) Patent No.: US 8,601,418 B1
(45) Date of Patent: Dec. 3, 2013

(54) INSTRUCTION-BY-INSTRUCTION CHECKING ON ACCELERATION PLATFORMS

(75) Inventors: Debapriya Chatterjee, Kolkata (IN); Anatoly Koyfman, Kiriat Yam (IL); Ronny Morad, Kiriat Ata (IL); Avi Ziv, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/471,536

(22) Filed: May 15, 2012

(51) Int. Cl.
*G06F 17/50* (2006.01)

(52) U.S. Cl.
USPC .......................................... 716/111; 716/106

(58) Field of Classification Search
USPC ......... 716/106, 111, 136; 714/33, 37; 703/13, 703/14, 21
See application file for complete search history.

(56) References Cited

U.S. PATENT DOCUMENTS

| | | | |
|---|---|---|---|
| 5,146,460 A * | 9/1992 | Ackerman et al. | 714/33 |
| 2007/0129924 A1 | 6/2007 | Verheyen et al. | |
| 2010/0223505 A1 * | 9/2010 | Andreev et al. | 714/37 |
| 2011/0191092 A1 | 8/2011 | Mizrachi et al. | |

* cited by examiner

*Primary Examiner* — Vuthe Siek
(74) *Attorney, Agent, or Firm* — Ziv Glazberg

(57) ABSTRACT

Method, apparatus and product for performing instruction-by-instruction checking on an acceleration platform. The method comprising: simulating by a hardware accelerator an execution of a testcase on a circuit design enhanced by a tracer module, wherein during the simulation the tracer module is configured to collect and record information regarding instruction which are completed by the circuit design and regarding register value modifications; and off-loading the recorded information from the hardware accelerator to a computerized apparatus, whereby based on the off-loaded recorded information, the computerized apparatus can perform an instruction-by-instruction checking that each recorded register modification is justified by an instruction which is was completed prior to the register modification.

16 Claims, 2 Drawing Sheets

INSTRUCTION-BY-INSTRUCTION CHECKING ON ACCELERATION PLATFORMS

TECHNICAL FIELD

The present disclosure relates circuit design verification in general, and to circuit design verification using acceleration platforms, in particular.

BACKGROUND

Computerized devices control almost every aspect of our life—from writing documents to controlling traffic lights. However, computerized devices are bug-prone, and thus require a testing phase in which the bugs should be discovered. The testing phase is considered one of the most difficult tasks in designing a computerized device. The cost of not discovering a bug may be enormous, as the consequences of the bug may be disastrous. For example, a bug may cause the injury of a person relying on the designated behavior of the computerized device. Additionally, a bug in hardware or firmware may be expensive to fix, as patching it requires call-back of the computerized device. Hence, many developers of computerized devices invest a substantial portion of the development cycle to discover erroneous behaviors of the computerized device.

During the development cycle of a circuit, the functionality of the circuit may be analyzed using functional verification. Functional verification may be performed using a simulator, such as HDL simulator, which provides a software simulation of the behavior of the circuit. Additionally or alternatively, an acceleration platform, also referred to as an "accelerator" or a "hardware accelerator", may be utilized to perform functional verification, The accelerator is a hardware-based simulator of the circuit design, such as using Application-Specific Integrated Circuit (ASIC), Field Programmable Gate Array (FPGA), or the like.

As accelerator is implemented in hardware it is much faster than a simulator. On the downside, there is a reduced visibility to the value of each signal in the circuit design during the simulated execution by the accelerator with respect to a simulator.

Instruction-by-Instruction (IBI) checking is a method of checking that a circuit design behaves correctly at the architectural level during simulation. An IBI checker operates during simulation and typically checks three things: (1) Instructions are completed in program order; (2) Register that are expected to be updated, are indeed updated with their expected values; and (3) Registers that are not expected to be updated, are indeed not updated.

BRIEF SUMMARY OF THE INVENTION

One exemplary embodiment of the disclosed subject matter is a computer-implemented method performed by a computerized device, comprising: simulating by a hardware accelerator an execution of a testcase on a circuit design enhanced by a tracer module, wherein during the simulation the tracer module is configured to collect and record information regarding instruction which are completed by the circuit design and regarding register value modifications; and off-loading the recorded information from the hardware accelerator to a computerized apparatus, whereby based on the off-loaded recorded information, the computerized apparatus can perform an instruction-by-instruction checking that each recorded register modification is justified by an instruction which is was completed prior to the register modification.

Another exemplary embodiment of the disclosed subject matter is a computerized system comprising a hardware accelerator, the system being adapted to perform the steps of: simulating by the hardware accelerator an execution of a testcase on a circuit design enhanced by a tracer module, wherein during the simulation the tracer module is configured to collect and record information regarding instruction which are completed by the circuit design and regarding register value modifications; and off-loading the recorded information from the hardware accelerator to a computerized apparatus, whereby based on the off-loaded recorded information, the computerized apparatus can perform an instruction-by-instruction checking that each recorded register modification is justified by an instruction which is was completed prior to the register modification.

Yet another exemplary embodiment of the disclosed subject matter is a computer program product comprising: a non-transitory computer readable medium retaining program instructions, which instructions when read by a processor, cause the processor which is operatively coupled to a hardware accelerator to performs the steps of: simulating by the hardware accelerator an execution of a testcase on a circuit design enhanced by a tracer module, wherein during the simulation the tracer module is configured to collect and record information regarding instruction which are completed by the circuit design and regarding register value modifications; and off-loading the recorded information from the hardware accelerator to a computerized apparatus, whereby based on the off-loaded recorded information, the computerized apparatus can perform an instruction-by-instruction checking that each recorded register modification is justified by an instruction which is was completed prior to the register modification.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1:
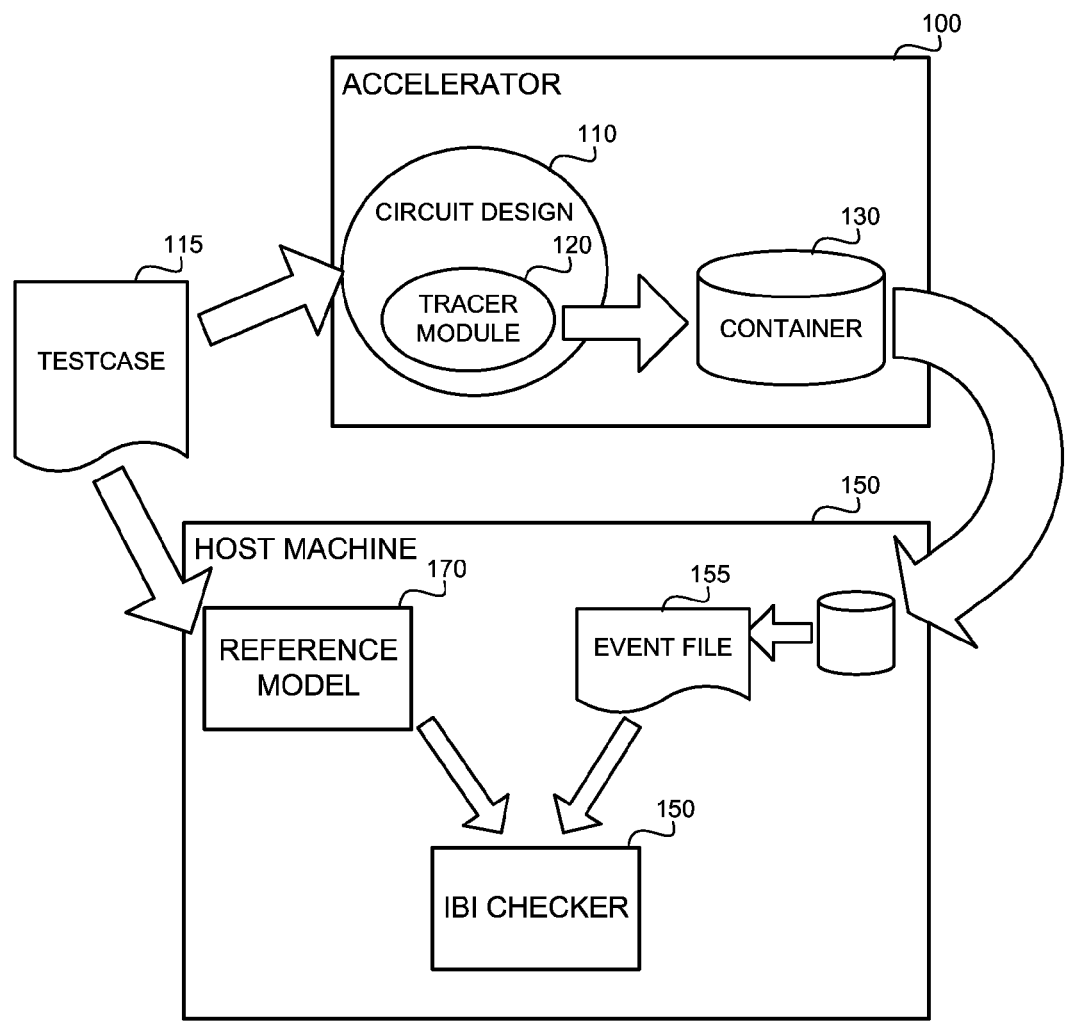
FIG. 1 shows a computerized environment in which the disclosed subject matter is used, in accordance with some exemplary embodiments of the subject matter.

The disclosed subject matter is described below with reference to flowchart illustrations and/or block diagrams of methods, apparatus (systems) and computer program products according to embodiments of the subject matter. It will be understood that each block of the flowchart illustrations and/ or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

A "design", a "circuit" or a "circuit design", as used herein, is a functional definition of an electronic circuit. A design may be provided using any Hardware Descriptive Language (HDL) including but not limited to VHDL, Verilog, SystemC, EDL, RTL, PSL or the like. In some exemplary embodiments, the design may correspond to an Integrated Circuit (IC) or a different hardware product.

One technical problem dealt with by the disclosed subject matter is to providing an Instruction-By-Instruction (IBI) checking capability during functional verification performed by a hardware accelerator.

Having an IBI checking capability on an acceleration platform may be desirable for several reasons. As one example, IBI checking adds a significant checking capability to a platform that has a limited checking capability. Hardware accelerators generally have limited checking capabilities, which does not check the architectural correctness of the design. As another example, the IBI checking can help debugging in cases where long computations complete with wrong results. In such a case it can point to the exact location of the instruction that completes with a wrong result.

The existing IBI solution from simulation platform cannot be applied as is to the known acceleration platforms because it is too complex to be implemented in hardware. Another obstacle to overcome, is limited visibility of the state of the design during execution thereof by a hardware accelerator, as opposed to software simulators.

Another technical problem is to provide the IBI checking capabilities without wasting redundant hardware accelerator resources. It will be noted that the hardware acceleration platform may be a valuable resource which may be relatively expensive.

One technical solution is to introduce to the circuit design a hardware implementation of a tracer module that is configured to collect and record information relating to the operation of the circuit design. In some exemplary embodiments, the tracer module collects and records a subset of the information that software simulation-based IBI checkers use, so as to reduce the overhead of performing IBI checking. In some exemplary embodiments, two types of information are collected and recorded: (1) instructions which are completed by the circuit design, and (2) register value modifications during the execution of the testcase. In some exemplary embodiments, the collected data may be address and affiliation (core and thread id) of each completed instruction and the value, identity and affiliation of each register modified during the execution of the testcase. In some exemplary embodiments, the tracer module may be configured to record the information in the order the events occur.

The recorded information may be off-loaded from the hardware accelerator to an alternative machine, such as a server, which may perform software implemented IBI checking by comparing the events and the order in which they occurred with the expected events. In some exemplary embodiments, a software-based reference model may be utilized to determine expected events.

In some exemplary embodiments, in response to each recorded completed instruction, it may be verified that the next instruction to be executed in the reference model is the completed instruction, and the instruction execution may be simulated by the reference model. All register modifications in the reference model may be stored in a register storage. Additionally or alternatively, in response to each recorded register modification, the register storage may be examined to verify that a corresponding register modification exists. The corresponding register modification may be removed from the register storage. The disclosed subject matter may determine using the reference model that the recorded register modification is justified.

It will be noted that in some exemplary embodiments the relation between which instruction is completed and which register modifications were performed is not recorded. Such information may be omitted and not recorded in order to reduce the overhead of the disclosed subject matter on the hardware accelerator.

In some exemplary embodiments, the recorded information may be compressed prior to off-loading, thereby reducing the resources required by the hardware accelerator to off-load the recorded information. In some exemplary embodiments, the accelerator may not concurrently simulate execution of a design and off-load information. Therefore, reducing the size of the information may reduce the time in which the hardware accelerator cannot be utilized for design simulation.

In some exemplary embodiments, the compression may be a lossless compression. Additionally or alternatively, the compression may be a lossy compression, such as using hash functions. In some exemplary embodiments, instead of uncompressing the recorded events to their original form, the expected events may be compressed using the same lossy compression thereby enabling compression thereof.

One technical effect of utilizing the disclosed subject matter is to provide enhanced checking capabilities during hardware acceleration. Another technical effect is to efficiently utilize the acceleration resource. Yet another technical effect is to enable IBI checking in a limited visibility environment.

Referring now to FIG. 1 showing a computerized environment in which the disclosed subject matter is used, in accordance with some exemplary embodiments of the subject matter.

An Accelerator 100 is a hardware accelerator having the capability of simulation, in hardware, an operation of a circuit design. Design 110 may be a circuit design of a target processor, chip, IC, or other circuit. Design 110 may be provided in a computer-readable form, such as using a hardware description language. In some exemplary embodiments, Design 110 may be provided in a VHDL form. Accelerator 100 may be operative to simulate operation of Design 110.

Design 110 may be enhanced by a Tracer Module 120. Tracer Module 120 may be configured to track instruction completion by Design 110, with respect to a Testcase 115. Additionally or alternatively, Tracer Module 120 may be configured to track register updates by Design 110 in response to performing instructions of Testcase 115. Tracer Module 120 may be provided in a computer-readable form, such as using a hardware description language. Tracer Module 120 may be provided in the same hardware description language used to define Design 110. In some exemplary embodiments, Design 110 may be enhanced by Tracer Module 120 by inlining or otherwise including Tracer Module 120 in Design 110.

In some exemplary embodiments, Tracer Module 120 may be configured to store tracked data in a Container 130 or using other data storage.

In some exemplary embodiments, Tracer Module 120 may comprise dedicated logic that will pack and compress the reported information in order to minimize the degradation of acceleration performance caused by the information off-loading. It will be noted that in some exemplary embodiment, recording the information requires utilizing of substantial resources of Accelerator 100 due to the limited visibility characteristic. As an example, in some exemplary embodiments, any bit of the enhanced Design that is recorded needs to be a-priori declared as such. In some cases, there may be a limit of a number of bits that can be declared as being visible and/or recordable. As another example, each bit being recorded may increase a time that Accelerator 100 requires to simulate a cycle of Design 110. Therefore, by compressing the tracked information, a smaller number of bits may be recorded, and the resource (Accelerator 100) is utilized in a more efficient manner.

In some exemplary embodiments, Tracer Module 120 may utilize lossless compression. In some exemplary embodiments, Tracer Module 120 may utilize lossy compression. When lossy compression is utilized, the disclosed subject matter may compress expected data to enable checking whether the expected results were achieved. Such a check may be performed by comparing the compressed recorded data with a compressed version of the expected data.

An off-loading process may be performed to off-load the recorded information from Accelerator 100 to a Host Machine 150 or other computerized apparatus. In some exemplary embodiments, off-loading may be performed periodically. In some exemplary embodiments, off-loading may be performed in response to a buffer of Container 130 reaching a threshold. In some exemplary embodiments, when off-loading data from Accelerator 100, simulation of Design 110 may be paused.

Based on the recorded information that is off-loaded to Host Machine 150, Host Machine 150 may generate an Event File 155 or a similar computer-retainable and computer-readable form comprising identified events. The event file may comprise events that were recorded. In some exemplary embodiments, there may be three types of events: (1) instruction completed, (2) register written and (3) test ended. The first two events may be extracted from the information off-loaded from Accelerator 100. The "test ended" event may be added automatically at the end of the event file. Alternatively or additionally, the "test ended" event may be added based on a recorded report that Testcase 115 was completed by the simulated operation of Design 110 by Accelerator 100.

An IBI Checker 160 may be configured to perform IBI checking of the operation of the Design 110 based on the off-loaded information. In some exemplary embodiments, IBI Checker 160 may perform IBI checking based on the generated event file. IBI Checker 160 may be a software-implemented checker that is executed by the hardware of Host Machine 150. IBI Checker 160 may be operatively coupled to a Reference Model 170 and utilize it to identify and report errors. IBI Checker 160 may run Reference Model 170 in parallel to the simulation and compare results obtained in the simulation environment with the results predicted by Reference Model 170. In some exemplary embodiments, expected results may be compressed using the same compression algorithm utilized to compress the recorded information, and the compressed actual results may be compared with the compressed expected results. A discrepancy between the results may indicate a bug.

Reference Model 170, also referred to as a golden model, may be operative to provide expected results of the Design 110 in response to Testcase 115. In some cases, Reference Model 170 may be available. For example, Reference Mode 170 may be available from the architecture owner (e.g., when developing a design that complies with public architecture, such as ARM or Power). Additionally or alternatively, Reference Model 170 may be developed by the design tool team. Additionally or alternatively, a previous version of the design may be utilized as a Reference Model 170. Reference Model 170 may be a software implantation of Design 110, an alternative implementation of Design 110, or the like.

In some exemplary embodiments, IBI Checker 160 may be provided with a set of expected results, such as manually defined by a user preparing Testcase 115 or automatically determined using a Reference Model 170. IBI Checker 160 may therefore not require to run Reference Model 170 in parallel to the simulation.

IBI Checker 160 may be configured to provide different checks. IBI Checker 160 may check that instructions completed in order. IBI Checker 160 may check that all modified registers are as expected. IBI Checker 160 may check that, when a test ends, all reported register modifications during the tests are accounted for by the expected results.

IBI Checker 160 may be configured to cause Reference Model 170 to load Testcase 115 (i.e., the same program that is run on Accelerator 100). For each event in the event file IBI Checker 160 may perform appropriate actions.

In response to an event indicating that an instruction was completed, IBI Checker 160 may check that address of the completed instruction is the address of the next instruction to be executed in Reference Model 170, therefore checking order of execution of the instructions. In addition, IBI Checker 160 may cause Reference Model 170 to simulate execution of the instruction and identify expected register modifications in response thereto. The register modifications may be stored, e.g., in a register storage or other data structure.

In response to an event indicating a register modification by Design 110, the register storage or other data storage may be inspected to determine whether the recorded register modification was expected by Reference Model 170. In case an appropriate register value modification is found, it can be determined that there is a justification to the register value modification by an instruction that was previously completed in the Reference Model 170. In case no such expected register value modification is found, an error may be reported as the register modification was not expected.

It will be noted that in some cases, registers may take a while to update and as the disclosed subject matter may store register value modification events as they occur (and in connection with the completed instruction), several instructions may be completed prior to seeing the effects of a previously completed instruction on the registers. By storing all expected register value modification in a single data structure, the data structure may be used to ensure that each register value modification is justified in view of an instruction which was already completed.

In some exemplary embodiments, in case that an appropriate register modification is identified in the data structure, that modification may be removed from the data structure as it used to justify the current examined event and should not be used to justify future event. By removing such register value modifications from the data structure it may be ensured that each such expected register value modification is used to justify exactly one register value modification event.

In response to a test end event, the data structure may be examined to check that it is empty. If the data structure is not empty, an error may be reported as an expected register value modification has not occurred.

In some exemplary embodiment, the data structure may provide in the expected register value modification information the instruction which is expected (e.g., by Reference Model 170) to cause the expected register value modification. Therefore, a report of an error may indicate which instruction did not perform its full effect.

Figure 2:
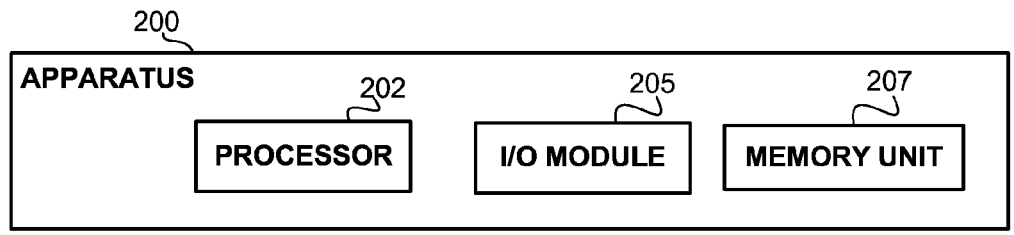
FIG. 2 shows a block diagram of an apparatus, in accordance with some exemplary embodiments of the disclosed subject matter.

Referring now to FIG. 2 showing an apparatus in accordance with some exemplary embodiments of the disclosed subject matter. An apparatus 200, such as 150 of FIG. 1, may be configured to perform IBI checking based on a simulated execution by an hardware accelerator, in accordance with the disclosed subject matter.

In some exemplary embodiments, Apparatus 200 may comprise a Processor 202. Processor 202 may be a Central Processing Unit (CPU), a microprocessor, an electronic circuit, an Integrated Circuit (IC) or the like. Processor 202 may be utilized to perform computations required by Apparatus 200 or any of it subcomponents. Processor 202 may be configured to execute Reference Model 170, IBI Checker 160, or the like. Processor 202 may be configured to analyze off-loaded information and generate event file.

In some exemplary embodiments of the disclosed subject matter, Apparatus 200 may comprise an Input/Output (I/O) Module 205. I/O Module 205 may be utilized to provide an output to and receive input from a user. I/O Module 205 may be operative to provide an error report to a user, such as a QA staff member, a verification engineer, a circuit designer, or the like.

In some exemplary embodiments, Apparatus 200 may comprise a Memory Unit 207. Memory Unit 207 may be a short-term storage device or long-term storage device. Memory Unit 207 may be a persistent storage or volatile storage. Memory Unit 207 may be a disk drive, a Flash disk, a Random Access Memory (RAM), a memory chip, or the like. In some exemplary embodiments, Memory Unit 207 may retain program code operative to cause Processor 202 to perform acts associated with any of the subcomponents of Apparatus 200. Memory Unit 207 may retain information off-loaded from Accelerator 100. Memory Unit 207 may retain generated event file. Memory Unit 207 may retain register storage or similar data structure.

Figure 3:
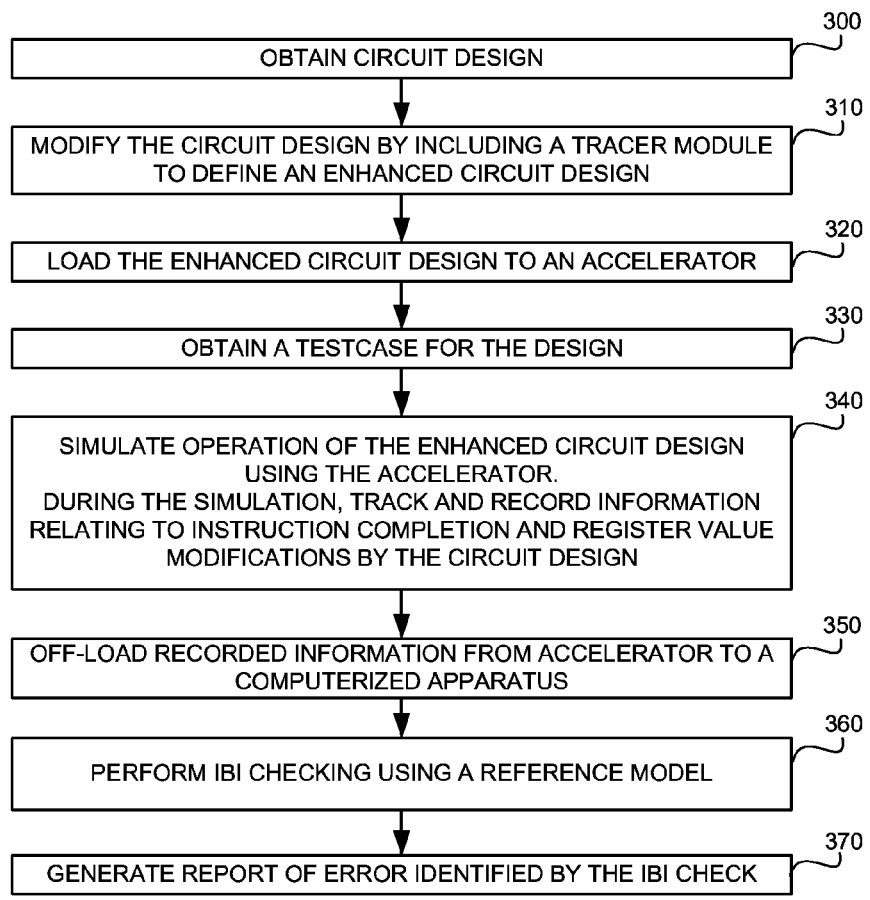
FIG. 3 shows a flowchart diagram of a method, in accordance with some exemplary embodiments of the disclosed subject matter.

Referring now to FIG. 3 showing a flowchart diagram of a method in accordance with some exemplary embodiments of the disclosed subject matter.

In Step 300, circuit design (e.g., 110) may be obtained.

In Step 310, having a tracer module (e.g., 120) defined by the same hardware description language as the circuit design, the circuit design may be modified to include the tracer module, whereby the circuit design enhanced by a tracer module is determined.

In Step 320, the enhanced circuit design may be loaded to an accelerator (e.g., 100).

In Step 330, a testcase (e.g., 115), such as a set of instructions for the circuit design defining a computer processor, or a similar stimuli to the circuit design may be obtained. The testcase may be generated by a stimuli generator or obtained from a manually defined set of testcases.

In Step 340, the operation of the enhanced circuit design in response to the testcase may be simulated by the accelerator. During the simulation, tracer module may track information regarding completed instructions and modification to register values. In some exemplary embodiments, the tracer module may record the tracked information in a compressed or non-compressed form.

In Step 350, the recorded information may be off-loaded from the accelerator to a different computational platform, such as Host Machine 150 or other computerized apparatus. In some exemplary embodiments, Steps 340-350 may be performed iteratively so as to periodically off-load recorded information prior to the completion of the simulation process. In some exemplary embodiments, the accelerator may be limited to either simulate operation of the enhanced circuit design or to off-load the information, and may not perform both functions simultaneously.

In Step 360, the computerized apparatus may perform IBI checking by determining that for each recorded register value modification there is a justification by an instruction which was completed prior to the register value modification. Step 360 may include operating a reference model (e.g., 170) to obtain expected results of completing each instruction. Furthermore, the reference model may ensure that the order of instruction operation is as expected. Furthermore, the reference model may be used to ensure that all expected register modifications have occurred in the simulated execution performed by the accelerator.

In some exemplary embodiments, the IBI checking of Step 360 may utilize register storage or a similar data structure to record expected register value modifications expected by the reference model in response to completing instruction. The data structure may be inspected to determine that each register value modification event in the accelerator is justified by the reference model based on a previously completed instruction.

In some exemplary embodiments, the IBI checking of Step 360 may be implemented in software. Furthermore, the reference model may be implanted in software.

In Step 370, a report may be generated providing errors identified during the IBI checking (360). The report may be provided in a human readable form, may be printed, may be displayed using a display, or otherwise provided to a user.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of program code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one skilled in the art, the disclosed subject matter may be embodied as a system, method or computer program product. Accordingly, the disclosed subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electro-magnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, and the like.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method performed by a computerized device, comprising:
    simulating by a hardware accelerator an execution of a testcase on a circuit design enhanced by a tracer module, wherein during the simulation the tracer module is configured to collect and record information regarding instruction which are completed by the circuit design and regarding register value modifications;
    off-loading the recorded information from the hardware accelerator to a computerized apparatus, whereby based on the off-loaded recorded information, the computerized apparatus can perform an instruction-by-instruction checking that each recorded register modification is justified by an instruction which is was completed prior to the register modification; and
    performing by the computerized apparatus instruction-by-instruction checking by determining for each register value modification in the recorded information whether there is a justification to the register value modification by a completed instruction that was completed prior to the register value modification.

2. The computer-implemented method of claim 1, wherein said determining comprises:
    simulating execution of the testcase on the circuit design with respect to the completed instructions using a software reference model, thereby determining expected register modifications in response to the completed instructions; and
    for each recorded register modification determining whether an appropriate register modification was determined by the software reference model.

3. The computer-implemented method of claim 2, further comprising determining, based on the software reference model, whether an order of completion of the instructions by the hardware accelerator is as expected.

4. The computer-implemented method of claim 2, further comprising determining, based on the software reference model, whether all expected instructions were executed by the hardware accelerator.

5. The computer-implemented method of claim 1, whereby the computerized apparatus can perform software-implemented instruction-by-instruction checking; and thereby improving checking capabilities of the hardware accelerator.

6. The computer-implemented method of claim 1, further comprising:
   obtaining the circuit design in a computer-readable form defined using a hardware description language;
   having the tracer module in a computer-readable form defined using the hardware description language;
   modifying the circuit design to include the tracer module, whereby the circuit design enhanced by a tracer module is determined; and
   loading the circuit design enhanced by a tracer module to the hardware accelerator.

7. A computer-implemented method performed by a computerized device, comprising:
   simulating by a hardware accelerator an execution of a testcase on a circuit design enhanced by a tracer module, wherein during the simulation the tracer module is configured to collect and record information regarding instruction which are completed by the circuit design and regarding register value modifications, wherein the tracer module is configured to compress the collected information thereby recording compressed recorded information; and
   off-loading the compressed recorded information from the hardware accelerator to a computerized apparatus, whereby based on the off-loaded recorded information, the computerized apparatus can perform an instruction-by-instruction checking that each recorded register modification is justified by an instruction which is was completed prior to the register modification.

8. The computer-implemented method of claim 7, wherein the tracer module is configured to perform a lossy data compression.

9. A computerized system comprising a hardware accelerator, the system being adapted to perform the steps of:
   simulating by the hardware accelerator an execution of a testcase on a circuit design enhanced by a tracer module, wherein during the simulation the tracer module is configured to collect and record information regarding instruction which are completed by the circuit design and regarding register value modifications;
   off-loading the recorded information from the hardware accelerator to a computerized apparatus, whereby based on the off-loaded recorded information, the computerized apparatus can perform an instruction-by-instruction checking that each recorded register modification is justified by an instruction which is was completed prior to the register modification; and
   wherein the computerized system further comprising the computerized apparatus, wherein the computerized apparatus comprising a processor, the processor being adapted to perform instruction-by-instruction checking by determining for each register value modification in the recorded information whether there is a justification to the register value modification by a completed instruction that was completed prior to the register value modification.

10. The computerized system of claim 9, wherein the processor is adapted to determine whether there is the justification by:
   simulating execution of the testcase on the circuit design with respect to the completed instructions using a software reference model, thereby determining expected register modifications in response to the completed instructions; and
   for each recorded register modification determining whether an appropriate register modification was determined by the software reference model.

11. The computerized system of claim 10, wherein the processor is further adapted to determine, based on the software reference model, whether an order of completion of the instructions by the hardware accelerator is as expected.

12. The computerized system of claim 10, wherein the processor is further adapted to determine, based on the software reference model, whether all expected instructions were executed by the hardware accelerator.

13. The computerized system of claim 9, wherein the tracer module is configured to compress the collected information thereby recording compressed recorded information and whereby said off-loading comprises off-loading the compressed recorded information.

14. The computerized system of claim 13, wherein the tracer module is configured to perform a lossy data compression.

15. The computerized system of claim 9, whereby the computerized apparatus can perform software-implemented instruction-by-instruction checking; and thereby improving checking capabilities of the hardware accelerator.

16. The computerized system of claim 9, wherein the system is further adapted to perform the steps of:
   obtaining the circuit design in a computer-readable form defined using a hardware description language;
   having the tracer module in a computer-readable form defined using the hardware description language;
   modifying the circuit design to include the tracer module, whereby the circuit design enhanced by a tracer module is determined; and
   loading the circuit design enhanced by a tracer module to the hardware accelerator.

* * * * *